United States Patent
Shiba et al.

(10) Patent No.: US 6,949,419 B2
(45) Date of Patent: Sep. 27, 2005

(54) DISPLAY DEVICE AND A METHOD FOR MANUFACTURING THE SAME

(75) Inventors: Takeo Shiba, Kodaira (JP); Mutsuko Hatano, Kokubunji (JP); Shinya Yamaguchi, Mitaka (JP); Seong-kee Park, Higashimurayama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/778,082

(22) Filed: Feb. 17, 2004

(65) Prior Publication Data

US 2004/0185605 A1 Sep. 23, 2004

Related U.S. Application Data

(62) Division of application No. 10/187,999, filed on Jul. 3, 2002, now Pat. No. 6,713,324.

(30) Foreign Application Priority Data

Dec. 12, 2001 (JP) ........................................ 2001-378027

(51) Int. Cl.[7] .............................................. H01L 21/00
(52) U.S. Cl. ...................................... 438/149; 438/150
(58) Field of Search ................................. 438/150, 149

(56) References Cited

U.S. PATENT DOCUMENTS

| | | | | |
|---|---|---|---|---|
| 5,696,003 A | * | 12/1997 | Makita et al. | ............... 438/166 |
| 5,821,562 A | * | 10/1998 | Makita et al. | ................. 257/64 |
| 6,136,632 A | * | 10/2000 | Higashi | ....................... 438/166 |
| 6,429,100 B2 | | 8/2002 | Yoneda | ....................... 438/487 |
| 6,559,821 B2 | | 5/2003 | Ichikawa et al. | .............. 345/92 |
| 6,723,590 B1 | * | 4/2004 | Zhang et al. | ................ 438/166 |
| 2002/0011983 A1 | | 1/2002 | Yamazaki et al. | ............. 345/92 |
| 2003/0022471 A1 | * | 1/2003 | Taketomi et al. | ............ 438/496 |
| 2003/0045043 A1 | | 3/2003 | Koyama | ...................... 438/200 |
| 2004/0060504 A1 | * | 4/2004 | Takeda et al. | ................. 117/84 |

FOREIGN PATENT DOCUMENTS

| | | |
|---|---|---|
| JP | 64-2088 | 1/1989 |
| JP | 11-121753 | 4/1999 |
| JP | 2000-243970 | 9/2000 |

* cited by examiner

*Primary Examiner*—Thao P. Le
(74) *Attorney, Agent, or Firm*—Miles & Stockbridge PC

(57) ABSTRACT

An image display device which includes a display pixel block and circuit blocks peripheral thereto. Each block has a circuit made of high-performance thin film transistors. The display pixel block and the peripheral circuit blocks including the four corners of the display device are formed on an image display device substrate of circuit-built-in type thin film transistors having a small circuit occupation surface area. A circuit including thin film transistors of a polycrystalline silicon film anisotropically crystal-grown and having crystal grains aligned in its longitudinal direction with a current direction is provided in the whole or partial surface of the display pixel block and circuit blocks. The longitudinal direction is aligned with a horizontal or vertical direction within the block, and blocks aligned in the horizontal and vertical directions can be arranged as mixed when viewed from an identical straight line.

6 Claims, 12 Drawing Sheets

DISPLAY DEVICE AND A METHOD FOR MANUFACTURING THE SAME

CROSS-REFERENCE TO RELATED APPLICATIONS

This application is a division of application Ser. No. 10/187,999 filed Jul. 3, 2002 now U.S. Pat. No. 6,713,324.

BACKGROUND OF THE INVENTION

The present invention relates to a thin film transistor and a method for manufacturing the transistor and more particularly, to an image display device having such thin film transistors built therein and a method for manufacturing the display device.

With respect to a TFT type liquid-crystal display device having thin film transistors (which will be referred to as TFT's, hereinafter), there is disclosed a TFT liquid-crystal display device with a circuit built therein (which will be also referred to as the circuit built-in type TFT liquid-crystal display device, hereinafter) wherein a pixel switching element and a display pixel region peripheral circuit make up a polycrystalline silicon TFT, e.g., in JP-A-64-2088.

There is also disclosed such a circuit built-in type TFT liquid-crystal display device, for the purpose of attaining a high circuit performance, which is improved in its TFT mobility by growing a silicon crystal largely in a specific direction to align a source/drain arrangement direction (current direction) nearly with the longitudinal direction of crystal grains, e.g., in JP-A-11-121753.

Further, in such a liquid-crystal display device as disclosed in an embodiment of, e.g., JP-A-2000-243970, a TFT source/drain arrangement direction (current direction) is aligned nearly with the longitudinal direction of crystal grains, and respective TFT's are arranged in horizontal and vertical blocks (in horizontal and vertical directions) at a display pixel array periphery when the TFT's are viewed from the front side surface of an array substrate. However, this display device fails to show a specific example of the TFT arrangement.

In the aforementioned JP-A-11-121753 of the TFT type wherein the current direction from the drain to the source is aligned nearly with the longitudinal direction of crystal grains, the performance of each TFT can be improved. However, since the current direction is limited to the horizontal (horizontal block) direction or vertical (vertical block) direction, this restricts the TFT array when layout design is made about a pixel array or a peripheral circuit, thus increasing a circuit occupation surface area.

In order to avoid such restriction to some extent, in the case of the embodiment shown in FIG. 1 in the aforementioned JP-A-2000-243970, laser irradiation is carried out in two horizontal and vertical directions, so that TFT's are arranged in the horizontal (horizontal block) direction and in the vertical (vertical block) direction. In the known example, when the TFT array is viewed on an identical straight line of the horizontal or vertical direction, the horizontal direction TFT's are arranged as not mixed with the vertical direction TFT's in the source/drain arrangement direction (current direction), no TFT is formed by laser irradiation so as to be arranged at a corner of the display device and at a pixel array, which results in limitation of a high-performance TFT array.

SUMMARY OF THE INVENTION

It is therefore an object of the present invention, in order to solve the above problems in the prior art, to provide an image display device wherein high-performance TFT's having a source/drain arrangement direction (current direction) substantially aligned with the longitudinal direction of crystal grains are arranged in a display pixel array, in a peripheral circuit in the vicinity thereof or in all or some of corners of the display device, TFT's (which will be referred to as horizontal-direction TFT's, hereinafter) in a horizontal (horizontal block) direction or TFT's (which will be referred to as vertical-direction TFT's, hereinafter) in a vertical (vertical block) direction are arranged so that the current directions of sources and drains in the horizontal-direction or vertical-direction TFT's are arranged in rows in the horizontal or vertical direction when viewed from the surface of a silicon film, or the TFT blocks in the horizontal and vertical directions when viewed from an identical straight line of the horizontal or vertical direction are mixedly provided.

Another object of the present invention is to provide a method for manufacturing an image display device which can easily manufacture the image display device mixedly including horizontal direction TFT's and vertical direction TFT's.

The invention of the present invention is summarized as follows.

The present invention is directed to an image display device driven by thin film transistors formed on a substrate, wherein the thin film transistors are made of a polycrystalline silicon film formed on the substrate, crystal grains of the polycrystalline silicon film are grown in a specific direction within the surface of the silicon film to be long in its growth direction and short in a direction substantially perpendicular thereto, an arrangement direction (current direction) of a source and drain of the thin film transistors is substantially aligned with a longitudinal direction of the crystal grains, the thin film transistors are divided into blocks each including at least one of the thin film transistor within the surface of the silicon film, at least one of the blocks is present in a periphery of a display pixel array, an arrangement direction of a source and drain of a plurality of thin film transistors included in the block is aligned with a horizontal or vertical direction when viewed from the surface of the silicon film within the same block, a plurality of the blocks are present when viewed from an identical straight line of the horizontal or vertical direction, and at least one location where blocks including the thin film transistors with the arrangement direction (current direction) of source and drains thereof arranged in the horizontal and vertical directions are mixedly provided.

The present invention is also directed to an image display device driven by thin film transistors formed on a substrate, wherein the thin film transistors are made of a polycrystalline silicon film formed on the substrate, crystal grains of the polycrystalline silicon film are grown in a specific direction within a surface of the silicon film to be long in its growth direction and short in a direction substantially perpendicular thereto, an arrangement direction (current direction) of a source and drain of the thin film transistors is substantially aligned with a longitudinal direction of the crystal grains, the thin film transistors are divided into rectangular blocks each including at least one of the thin film transistors within the surface of the silicon film, at least one of the blocks is present in at least one corner of the display device or in a part of periphery of a display pixel array, an arrangement direction (current direction) of a source and drain of a plurality of thin film transistors included in the block is aligned with a horizontal or vertical direction when viewed from the surface of the silicon film within the same block, the arrangement direction (current direction) of the source and drain of the thin film transistors are in the horizontal or vertical direction, or the horizontal and vertical direction blocks are mixedly provided.

In a preferred embodiment of the present invention, the block includes at least one display pixel array selected from the group of a buffer circuit for driving thin film transistors in display pixels, a sampling switch circuit, a precharging circuit, a shift register circuit, a decoder circuit, a clock waveform trimming circuit, a digital-analog converter circuit, a power voltage transformer circuit, a level shifter circuit, a timing controller circuit, an amplifier circuit, a memory, a processor, a gate array and a communication circuit.

In a preferred embodiment of the present invention, the block includes a pixel driving circuit, a pixel memory or a pixel inverter circuit in the display pixel array.

The present invention is further directed to a method for manufacturing an image display device driven by thin film transistors of a polycrystalline silicon film formed on a substrate, comprising:

a step of depositing an amorphous silicon film on the substrate;

a first laser irradiation step of scanning a laser beam relative to the substrate in a horizontal or vertical first scanning direction of the surface of the substrate;

a second laser irradiation step of scanning the laser beam relative to the substrate in a second direction perpendicular to the first scanning direction; and a step of forming the thin film transistors on the polycrystalline silicon film, wherein the amorphous silicon film is crystallized and a polycrystalline silicon film is formed in the first and second laser irradiation steps, and the laser beam is irradiated on at least one region of the substrate only in either one of the first and second steps.

The present invention is also directed to a method for manufacturing an image display device driven by thin film transistors of a polycrystalline silicon film formed on a substrate, comprising:

a step of depositing an amorphous silicon film on the substrate;

a laser irradiation step of scanning a laser beam relative to the substrate in a horizontal or vertical direction of the surface of the substrate while irradiating the laser beam to crystallize the amorphous silicon film and to form the polycrystalline silicon film; and a step of forming the thin film transistors of the polycrystalline silicon film, wherein the laser irradiation step is carried out once.

In accordance with the present invention, in TFT's requiring a high performance such as the TFT's of a peripheral circuit or a pixel array, the grain size of the TFT's in the current direction can be made long and the crystal defect density can be reduced. Thus, since the TFT mobility and reliability are increased and a leak current is reduced, a high circuit performance and a low power consumption caused by the reduction of a power voltage can be realized.

Further, since the horizontal and vertical direction TFT blocks can be mixedly provided, its layout can be less restricted, the layout surface area can be reduced, and the horizontal or vertical direction TFT blocks can be arranged even in the four corners of the display device.

In accordance with the manufacturing method of the present invention, further, the polycrystalline silicon film of the horizontal or vertical TFT's is formed by performing the scanning operation of the laser beam twice both in the horizontal and vertical direction, and the laser beam irradiation is carried out only once as necessary. As a result, the horizontal and/or vertical direction TFT's can be selectively made for each block, and high-performance TFT's can be realized for each block. Furthermore, when the repetitive irradiation and non-irradiation of the laser beam are carried out, for example, by electrically turning the laser beam ON and OFF, the horizontal and vertical direction TFT's can be selectively manufactured while preventing reduction of a laser scanning speed, thus enabling an increased throughput.

In accordance with another manufacturing method, the polycrystalline silicon film of the horizontal or vertical direction TFT's is formed through one-time scanning operation of the laser beam in the horizontal or vertical direction. Therefore high-performance TFT's can be realized in each block with an increased throughput.

Other objects, features and advantages of the invention will become apparent from the following description of the embodiments of the invention taken in conjunction with the accompanying drawings.

DETAILED DESCRIPTION OF THE EMBODIMENTS

Figure 1:
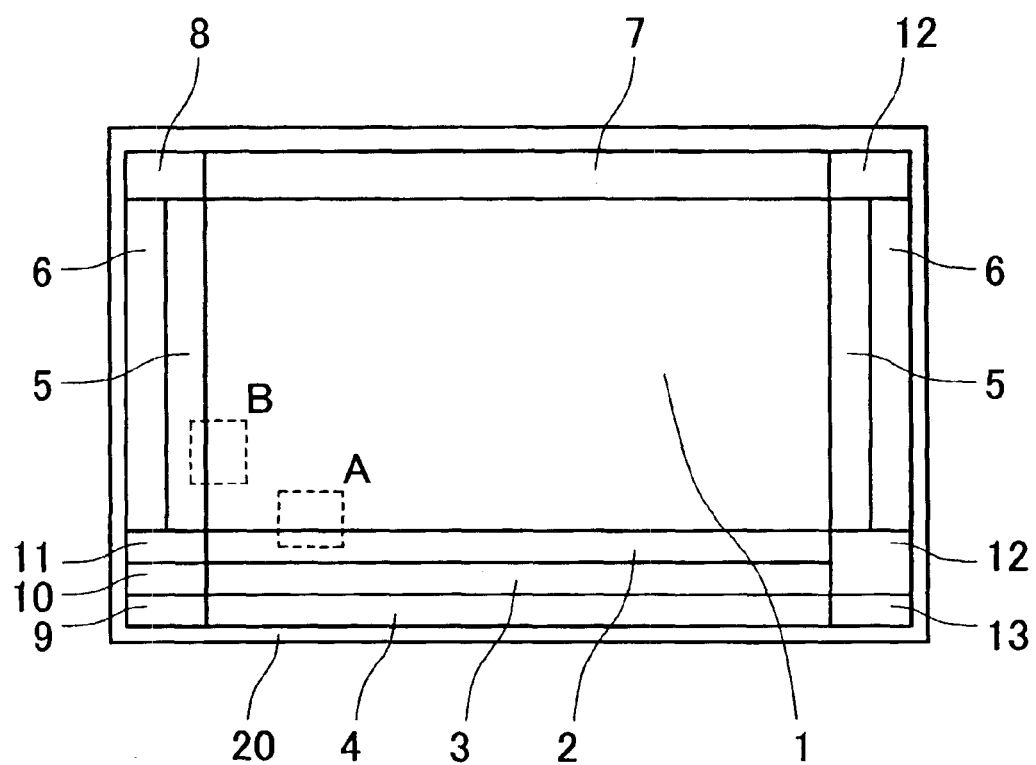
FIG. 1 shows, in a model form, a plan view of a schematic structure of a circuit built-in type TFT display device in accordance with an embodiment 1 of the present invention.

Embodiments of the present invention will be explained in detail with reference to the accompanying drawings. In this connection, in all the drawings for explaining the embodiments, parts having the same functions are denoted by the same reference numerals and double explanation thereof will be omitted.

Figure 2:
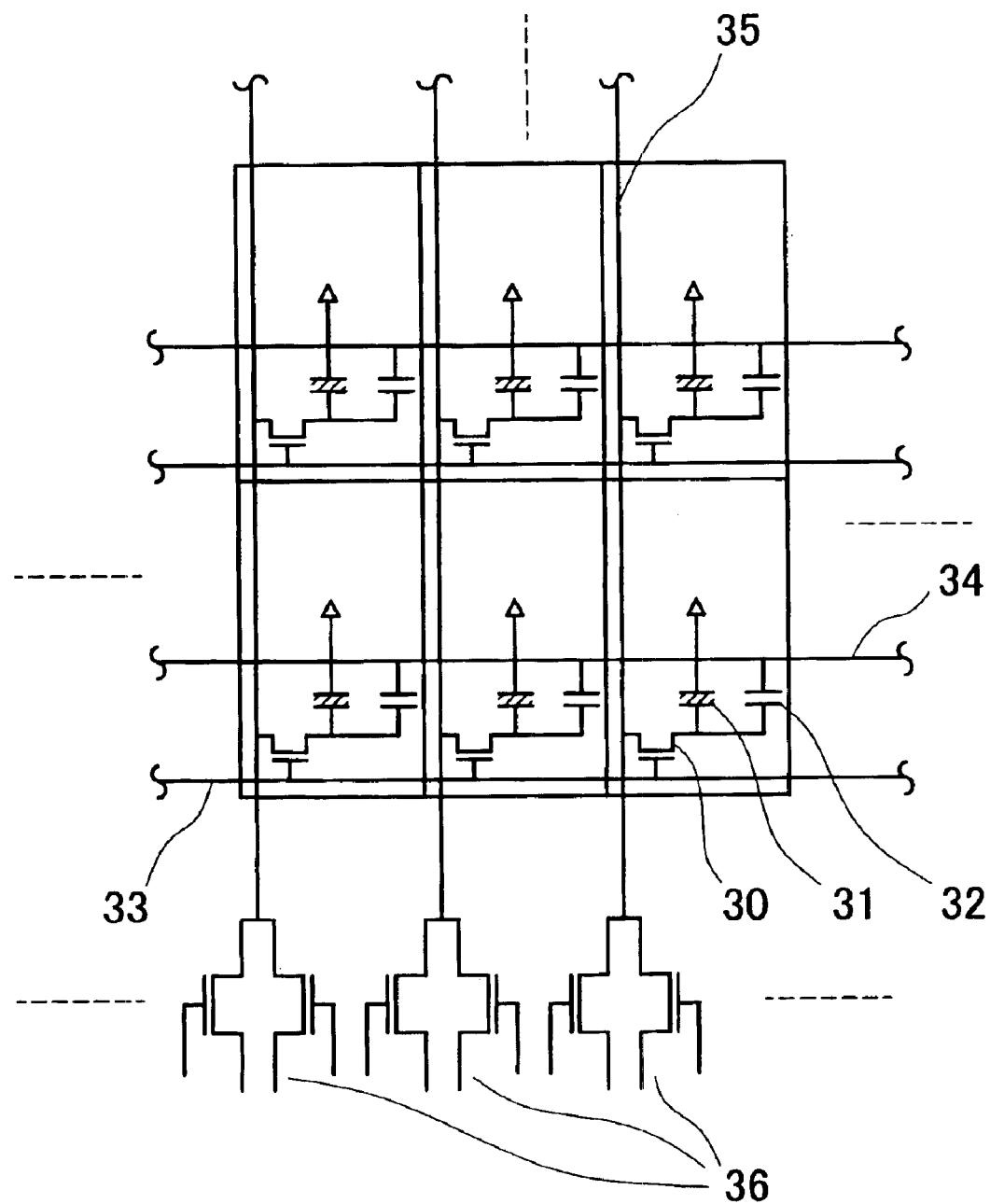
FIG. 2 is a circuit diagram of the schematic structure of the circuit built-in type TFT liquid-crystal display device in accordance with the embodiment 1 of the present invention.
Figure 3:
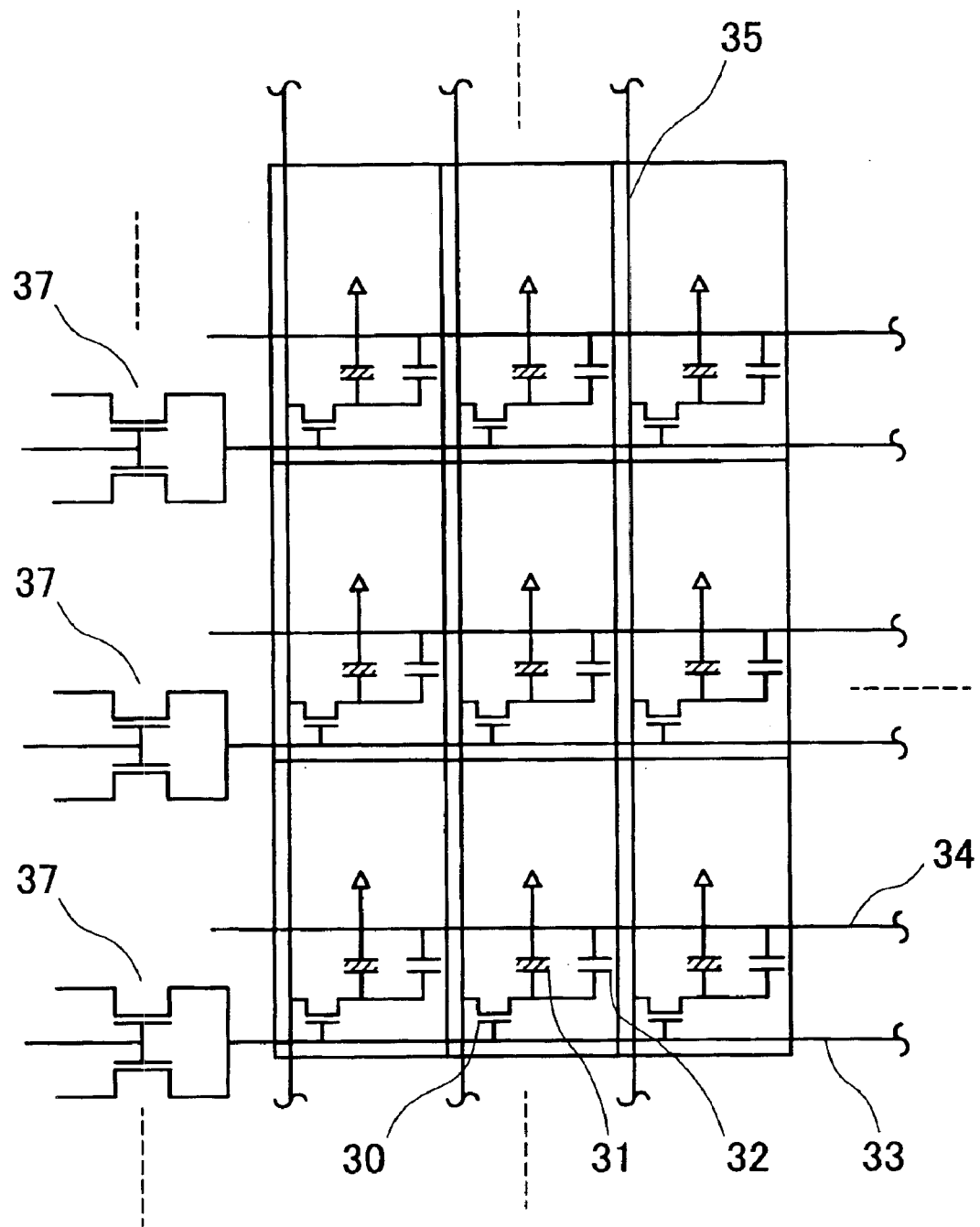
FIG. 3 is another circuit diagram of the schematic structure of the circuit built-in type TFT liquid-crystal display device in accordance with the embodiment 1 of the present invention.
Figure 4:
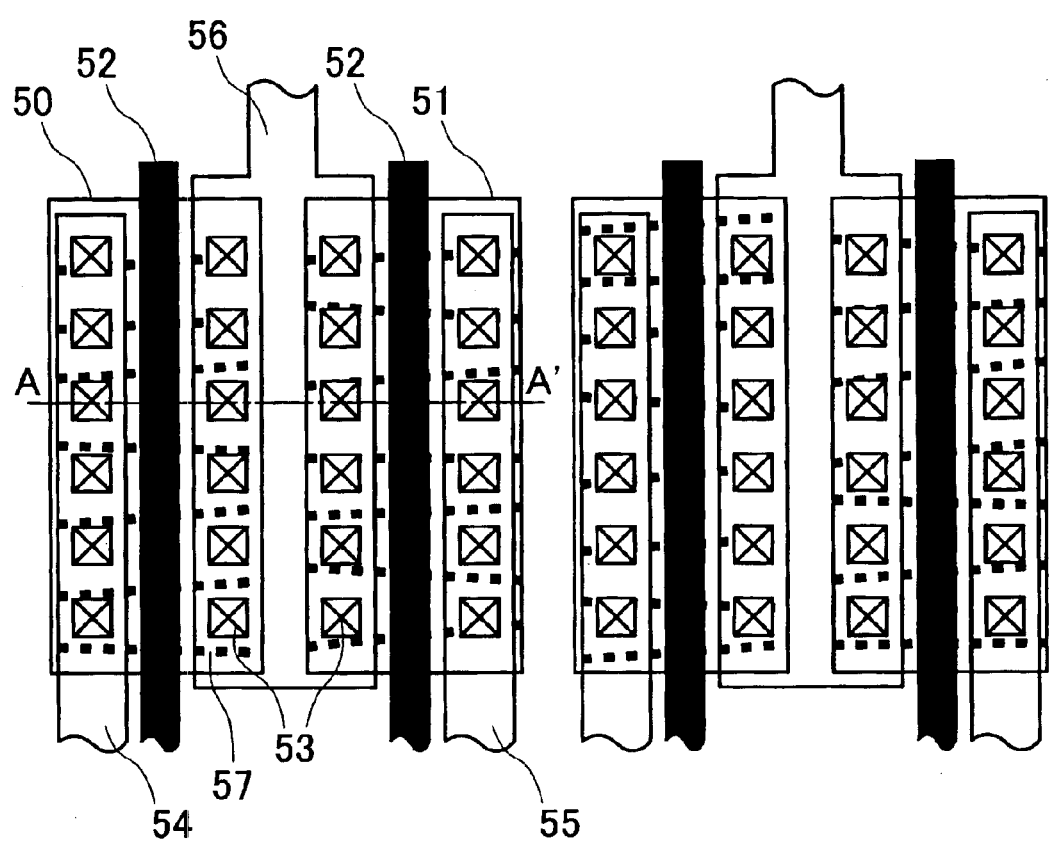
FIG. 4 shows, in model form, a plan view of the schematic structure of the circuit built-in type TFT liquid-crystal display device in accordance with the embodiment 1 of the present invention.
Figure 5A:
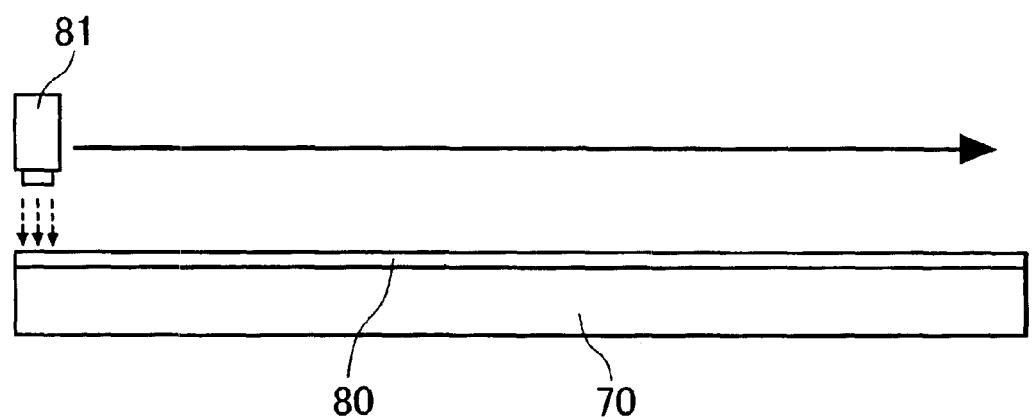
FIGS. 5A and 5B show, in model form, cross-sectional views of the circuit built-in type TFT liquid-crystal display device in accordance with the embodiment 1 of the present invention for explaining a TFT forming process.
Figure 5B:
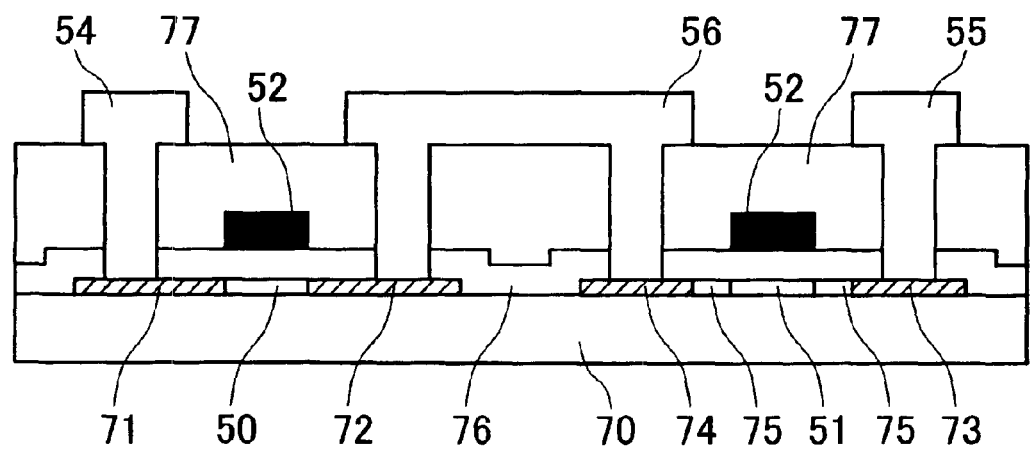
Figure 6:
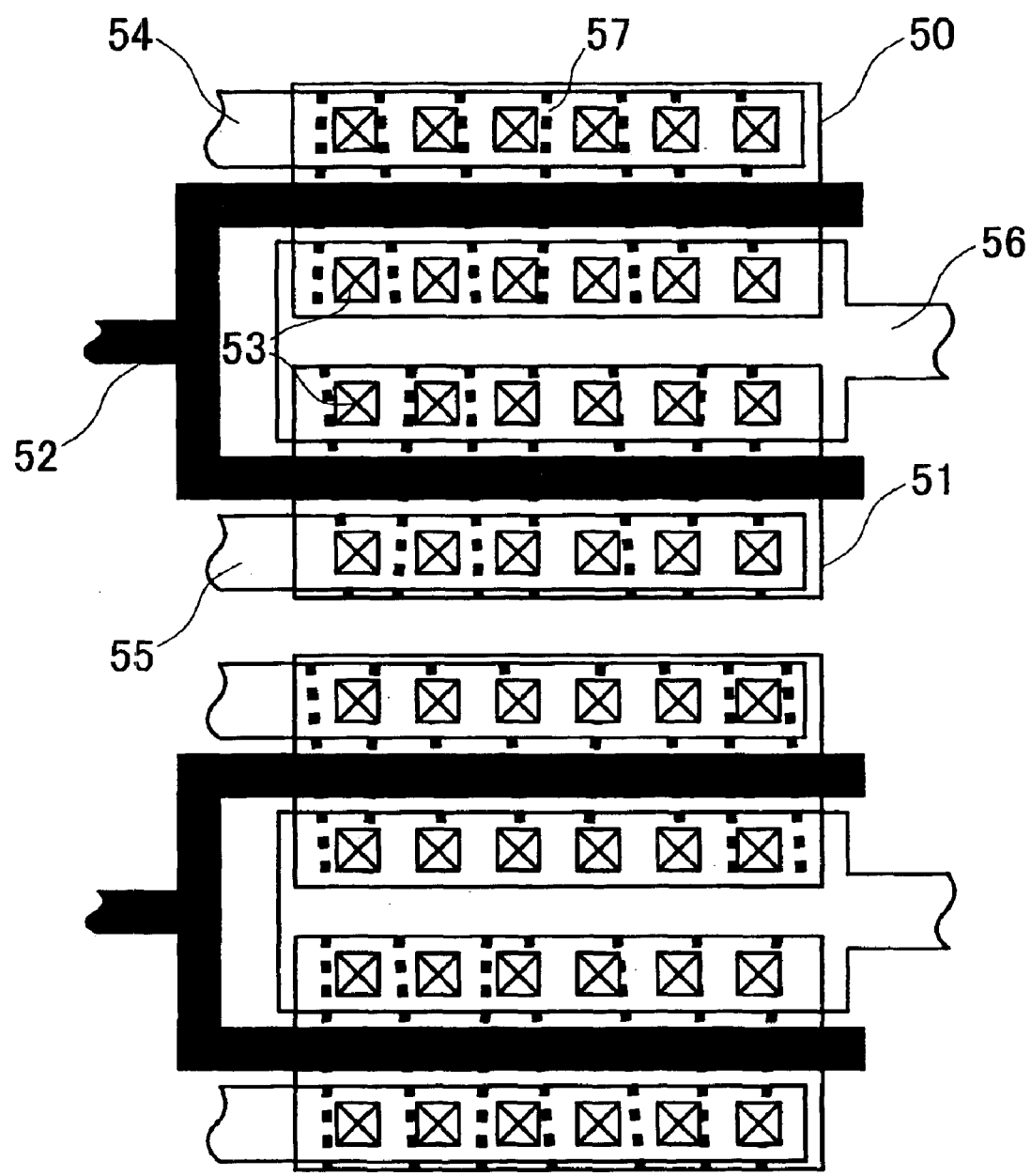
FIG. 6 shows, in model form, a plan view of the schematic structure of the circuit built-in type TFT liquid-crystal display device in accordance with the embodiment 1 of the present invention.
Figure 7:
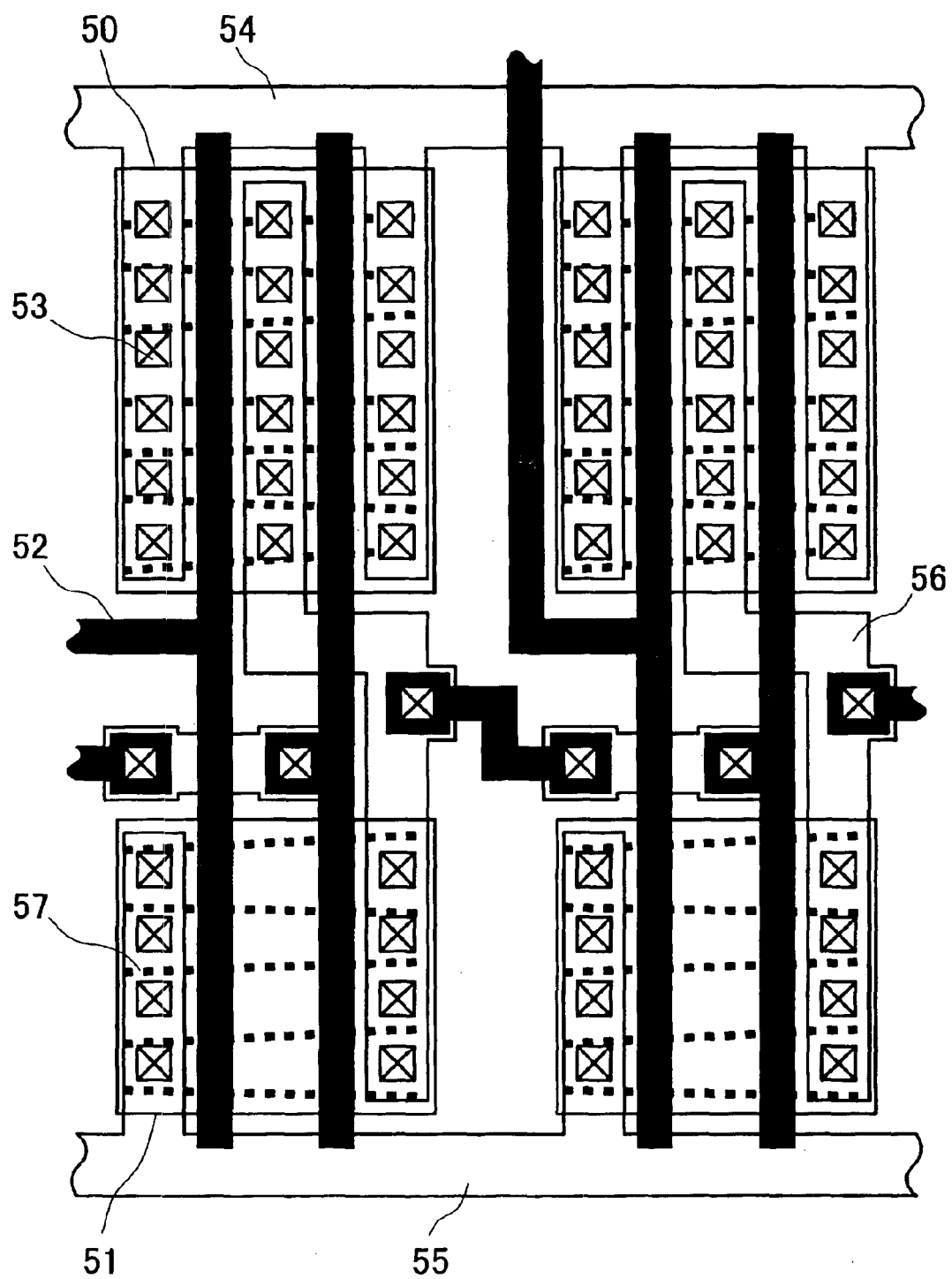
FIG. 7 shows, in model form, another plan view of the schematic structure of the circuit built-in type TFT liquid-crystal display device in accordance with the embodiment 1 of the present invention.
Figure 8:
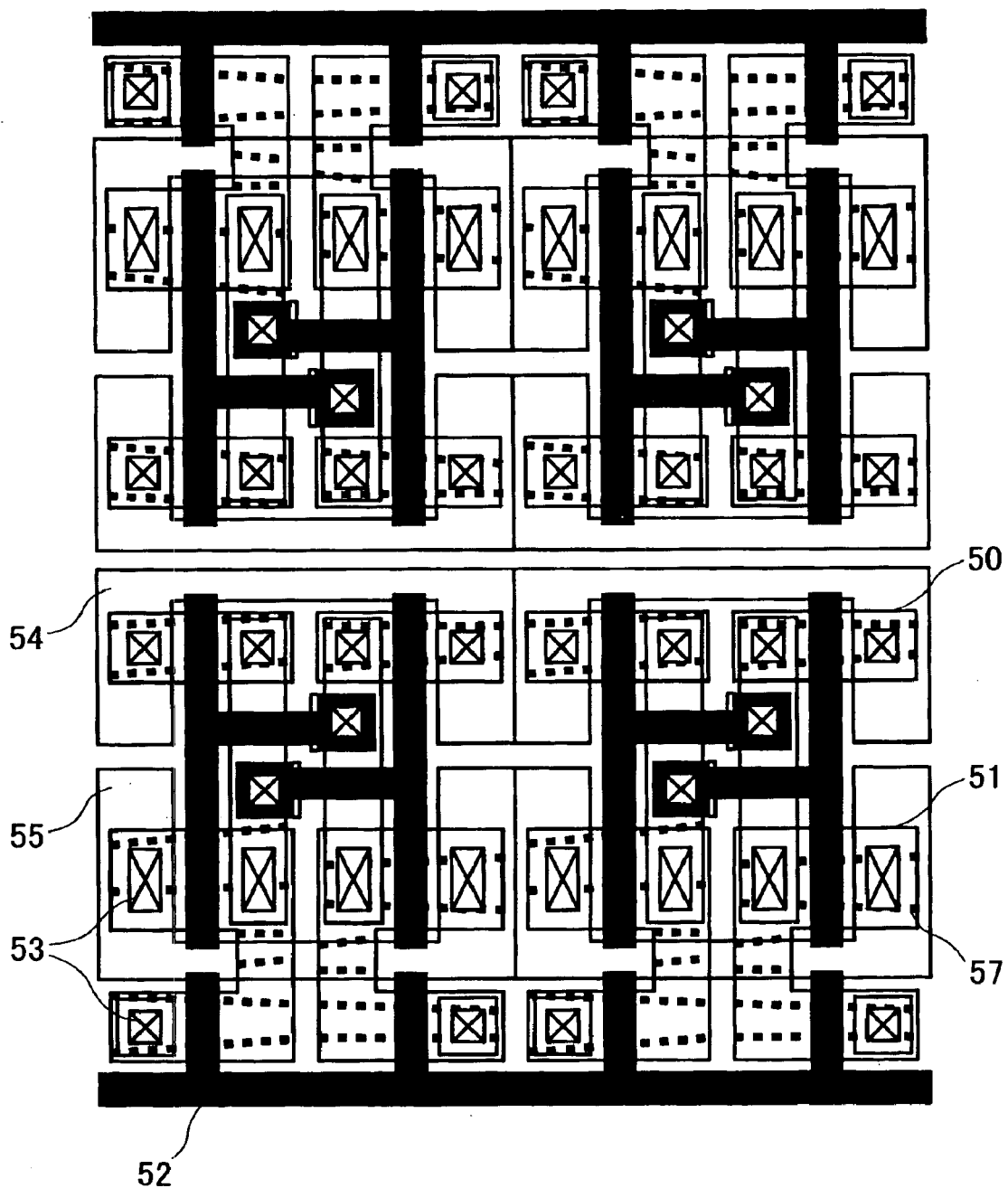
FIG. 8 shows, in model form, a further plan view of the schematic structure of the circuit built-in type TFT liquid-crystal display device in accordance with the embodiment 1 of the present invention.

Embodiment 1:

FIG. 1 shows, in model form, a plan view of a schematic structure of a circuit built-in type TFT display device liquid-crystal display device in accordance with an embodiment 1 of the present invention. FIGS. 2 and 3 show circuit diagrams. More specifically, FIG. 2 shows a circuit diagram of part of pixel and peripheral circuits in a region A surrounded by a dotted line in FIG. 1, and FIG. 3 shows a circuit diagram of part of pixel and peripheral circuits in a region B surrounded by a dotted line in FIG. 1 respectively. FIG. 4 shows, in model form, a plan view of TFT's arranged in peripheral circuit 36 in FIG. 2. FIGS. 5A and 5B show, in model form, cross-sectional views of a part of FIG. 4 taken along a chain-dotted line A–A' in FIG. 4 for explaining its manufacturing method. FIG. 6 shows, in model form, a plan view of TFT's arranged in a peripheral circuit 37 in FIG. 3. FIGS. 7 and 8 show, in model form, plan views of TFT array examples of the peripheral circuit.

The present liquid-crystal display device is of a partially transmissive type for use in a mobile personal computer (PC). More specifically, the display device is of a TFT type with a built-in circuit formed on a glass substrate, and has a liquid crystal layer which is driven by a pixel TFT to control light transmission from a light source or the reflection of external light and to display a color image on a display screen. As shown in FIG. 1, blocks of complementary MOS circuits (which will be referred to as the CMOS circuits, hereinafter) are arranged in a periphery of a display pixel block 1 on a glass substrate 20. More concretely, the peripheral blocks include a sampling switch/buffer circuit block 2 for driving a signal electrode line, a shift register circuit block 3, a digital-analog converter circuit block 4 with a memory, a buffer circuit block 5 for driving a scan electrode line, a shift register circuit block 6, a precharging circuit block 7, a power voltage transformer circuit block 8, a level shifter circuit block 9, a timing controller circuit block 10, a non-volatile memory block 11, a gate array block 12, and a data communication circuit block 13 with an amplification circuit.

The display pixel block 1 has pixels arranged in a matrix and has a display zone area with a diagonal line length of about 15 cm or so. The pixels are arranged by about 1280 dots in a horizontal direction, about 1024 dots in a vertical direction, that is, by a total of about 1,310,000. In this connection, the diagonal line length and the number of pixels are not limited to the above example values. For example, the present invention may be applied to a liquid-crystal display device for a cellular phone having a diagonal line length of about 5 cm or to a liquid-crystal display device for a notebook-sized PC or monitor having a diagonal line length of 20 cm or more.

FIG. 2 shows two pixels and a part of a peripheral drive circuit in the region A in FIG. 1. Pixels include ones for red, green and blue display, for each of which an N type channel pixel TFT 30 having a gate length of about 1 $\mu$m is provided. A drain region of each column of the pixel TFT's 30 arranged in a matrix is connected to an associated signal electrode line 35, and a source region of each pixel TFT 30 is connected to a pixel electrode (not shown). Gate electrodes of the pixel TFT's 30 in each row are connected to an associated scan electrode line 33. Since a liquid crystal layer is provided between a pixel electrode and a counter electrode (common electrode), a liquid crystal parasitic capacitance 31 is equivalently connected to each pixel electrode. A storage capacitance 32 is connected between the pixel electrode and a storage capacitance line 34. The sampling switch/buffer circuit block 2 for driving the signal electrode line 35 is provided adjacent to the display pixel block 1, and each of the circuits 36 each having both of P- and N-type channel TFT's having a gate length of about 1 $\mu$m is connected to the associated signal electrode line 35.

Each signal electrode line 35 shown in FIG. 2 is connected to an associated analog signal input line via a sampling switch circuit. The sampling switch circuit, which inputs a shift pulse for video signal input from the shift register circuit block 3 via a buffer circuit, is scanned by the shift register circuit block 3.

Shown in FIG. 3 are three pixels and a part of the peripheral drive circuit in the region B in FIG. 1. The structure of each pixel is the same as that in FIG. 2. The buffer circuit block 5 for driving the scan electrode line 33 is provided adjacent to the display pixel block 1, each circuit 37 having both of P- and N-type channel TFT's and having a gate length of about 1 $\mu$m pin is connected to the associated signal electrode line 35.

Each scan electrode line 33 shown in FIG. 3 is connected to the shift register circuit block 6 via the buffer circuit block 5. The shift register circuit block 6 performs shifting operation and outputs a scanning shift pulse to scan the scan electrode lines 33.

In this connection, the pixel structures of FIGS. 2 and 3 are both made up of the liquid crystal layer, liquid crystal driving TFT and storage capacitance, but a pixel memory or pixel circuit may be added thereto.

These circuit blocks and the TFT's in the display pixel block are formed in a polycrystalline silicon film provided on a glass substrate. FIG. 4 shows a plan view of two of such circuits 36 as shown in FIG. 2 and arranged side by side, and FIGS. 5A and 5B show cross-sectional views of a circuit taken along line A–A' in FIG. 4 for explaining its manufacturing method. An island 50 of polycrystalline silicon of the P type channel TFT and an island 51 of polycrystalline silicon of the N type channel TFT are arranged side by side, and a gate electrode 52 is provided to each island. A pair of the P and N type channel TFT's, which form the circuit 36, are arranged along the display pixel block 1 in a horizontal direction How to manufacture these TFT's are as follows. As shown in FIG. 5A, an amorphous silicon film 80 is deposited by plasma CVD (chemical vapor deposition) process on a glass substrate 70 to have a thickness of about 50 to about 100 nm, and is subjected to irradiation of second higher harmonics having a wavelength of, e.g., 532 nm from a solid-state laser 81 for its crystallization to form a polycrystalline silicon film. At this time, the solid-state laser is scanned in the horizontal direction when viewed from the surface of the display device while irradiating the harmonics to thereby promote the crystal growth of a desired region and to form crystal grains long in the horizontal direction. Thereafter, the solid-state laser is further scanned in the vertical direction when viewed from the surface of the display device while irradiating the harmonics to thereby promote the crystal growth of a desired region and to form crystal grains long in the vertical direction. In this connection, the laser for crystallization is not limited to the solid-state laser but an excimer laser having a wavelength of, e.g., 308 nm or 248 nm may be employed.

As shown in FIG. 5B, next, the islands 50 and 51 of polycrystalline silicon forming the P and N type channel TFT's are patterned by lithography and silicon etching, and a gate oxide film 76 of silicon dioxide is deposited by the plasma CVD process to have a thickness of about 50 to about 100 nm. Thereafter a first metal electrode of, e.g., molybdenum as a base material is deposited to have a thickness of about 100 to about 200 nm, subjected to patterning and processing operations to form a gate electrode 52. At this time, a processing gate length was set to be about 1 $\mu$m. A gate width was set to have a value of about 1 to about 20 $\mu$m to obtain a necessary function associated with circuit specifications.

After this, impurities are introduced into the polycrystalline silicon films 50 and 51 with use of the gate electrode as a mask, the films are subjected to annealing treatment at a temperature of 600° C. or less for its activation, thereby forming a source layer 71 and drain layer 72 of the P type channel TFT, a source layer 73 and drain layer 74 of the N type channel TFT, and a lightly doped drain (LDD) layer 75 for reducing the electric field. In this regard, the LDD layer 75 and source and drain layers 71, 72, 73 and 74 may be formed by a method for selectively introducing impurity ions with use of a resist mask or by a method for selectively introducing impurity ions through a self-alignment process. It goes without saying that the processing gate length and gate width are not limited to the aforementioned values but may be set at desired values depending the circuit specifications to obtain a necessary function.

Thereafter an interlayer dioxide layer 77 is deposited by the plasma CVD process to have a thickness of about 500 nm, contact via holes are made therein, and then a second metal electrode of aluminum as its main material is used to form a source electrode 54 of the P type channel TFT, a source electrode 55 of the N type channel TFT and an electrode 56 provided to connect drains of the both TFT's, thus completing a TFT. Simultaneously, these first and second metal electrodes are used also as wirings for circuit formation. Thereafter an interlayer, a transparent pixel electrode, etc. are provided to complete a TFT substrate. It goes without saying that the materials of the electrodes and insulating film used in the manufacturing method are not limited to the aforementioned specific materials but other materials may be used, providing substantially the same effects.

By such a manufacturing method as mentioned above, there is formed a TFT wherein a crystal grain surrounded by boundaries 57 of silicon grains (which will be referred to as the grain boundaries, hereinafter) shown by dotted lines in FIG. 4 is formed as extended by 10 $\mu$m or more in the current direction from the drain to source. In this way, since the length of the crystal grain in the longitudinal direction can be made larger than the gate length and a crystal defect density in the current direction can be reduced, the mobility of the TFT can be increased to 500 cm$^2$/Vs or more.

Similarly, FIG. 6 shows a plan view of two of the circuits 37 in FIG. 3 arranged side by side, wherein parts having the same reference numerals as those in FIG. 4 have the same functions. In this case, since the circuits 37 are arranged along the display pixel block 1 side by side in the vertical direction, the scanning operation of the solid-state laser 81 is carried out in the vertical direction for the region of the buffer circuit block 5. Even in this region, a TFT wherein a crystal grain surrounded by the grain boundaries 57 is extended by 10 $\mu$m or more in the current direction from the drain to source is formed. Thus the mobility of the TFT can be increased to about 500 cm$^2$/Vs.

Similarly shown in FIG. 7 is an example of a TFT array of the gate array blocks 12 provided at upper and lower corners of the display device. FIG. 8 shows an example of a TFT array of the digital-analog converter circuit block 4 with a memory at its memory part. In these examples, crystal grains are extended in the horizontal direction and the current direction from the drain to source in any of the crystal grains coincides with the longitudinal direction of the crystal grain, whereby the mobility of the TFT can be increased to 500 cm$^2$/Vs or more.

As shown in these drawings, in each circuit block shown in FIG. 1, the longitudinal direction of the crystal grains in each block is aligned with the horizontal or vertical direction so as to coincide with the TFT current direction. In the present embodiment, vertical direction TFT's include the display pixel block 1, buffer circuit block 5, shift register circuit block 6, power voltage transformer circuit block 8, and data communication circuit block 13; whereas horizontal direction TFT's include the sampling switch/buffer circuit block 2, shift register circuit block 3, digital-analog converter circuit block 4, precharging circuit block 7, level shifter circuit block 9, timing controller circuit block 10, non-volatile memory block 11, and gate array block 12.

When the scanning operation of the solid-state laser for crystallization of these block regions is carried out, it is necessary to scan the regions of the horizontal direction TFT's only in the horizontal direction and to scan the regions of the vertical direction only in the vertical direction. To this end, a plurality of such solid-state lasers are arranged in a direction vertical to the scanning direction to previously input TFT array information for each block in the lasers, so that, when the scanning to the horizontal direction is carried out under automatic control of a computer, the oscillation of the lasers is electrically stopped to prevent irradiation of laser beams in the block regions of the vertical direction TFT's. Similarly, the scanning operation is carried out in the vertical direction, the irradiation of laser beams is prevented in the block regions of the horizontal direction TFT's. With such an arrangement, selective laser irradiation depending on the block region can be realized with a constant scanning speed.

As another method of such selective laser irradiation, selective laser irradiation can be carried out by a mechanical means such as a shutter while not stopping the laser oscillation, or by patterning such a material as able to shield the laser beams on the block regions.

In the present embodiment, the blocks 2 to 7 are provided along four sides of the display pixel block 1, and the blocks 8 to 12 are provided at four corners of the display device. In each block, the TFT's within the same block are aligned with those of either the horizontal or vertical direction TFT's and thus even with the current direction. When these blocks are viewed on an identical straight line of the horizontal or vertical direction, there exist at least one location where vertical and horizontal direction TFT blocks are mixed. That is, when the blocks 9, 4 and 13 are viewed from the straight line of the horizontal direction including these blocks, for example, the blocks 9 and 4 are made up of the horizontal direction TFT's while the block 13 is made up of the vertical direction TFT's. When the blocks 12, 5 and 13 are viewed from the straight line of the vertical direction including these blocks, the block 12 is made up of the horizontal direction TFT's while the blocks 5 and 13 are made up of the vertical direction TFT's. When this horizontal and vertical TFT's are mixedly arranged in this way, effective layout can be realized and the circuit occupation surface area can be reduced. Further, the selective laser irradiation method of the present invention is applied, the TFT mobility of each block region can be increased up to about 500 cm$^2$/Vs.

Embodiment 2:

Although explanation has been made in connection with the liquid-crystal display device as a display device in the aforementioned embodiment, explanation will be made as to a circuit built-in type TFT of organic EL (electroluminescent) display device using an organic light emitting diode in place of the liquid crystal as an embodiment 2 of the present invention.

The present display device is of a self light emitting type for use in a mobile personal computer. More specifically, the display device is a circuit built-in type TFT organic EL display device formed on the glass substrate, and displays a color moving image on its display screen based on the organic light emitting diode. Even in the present embodiment 2, as in the aforementioned embodiment 1, a block made of a complementary MOS circuit is arranged in the periphery of the display pixel block 1 as shown in FIG. 1.

The display pixel block 1 has pixels arranged in a matrix, a display region area of which has a diagonal line length of about 10 to about 15 cm. The pixels, of the block 1 are arranged to be about 1,280 dots in its horizontal direction and about 1,024 dots in the vertical direction, that is, a total of about 1,310,000 dots. The value of the diagonal line length and the number of pixels are not limited to the above specific values. For example, the present invention can be applied even to a liquid-crystal display device for a mobile personal computer having a diagonal line length of about 5 cm or to an organic EL display device for a notebook-sized personal computer, monitor or television screen having a diagonal line length of 20 cm or more.

Figure 9:
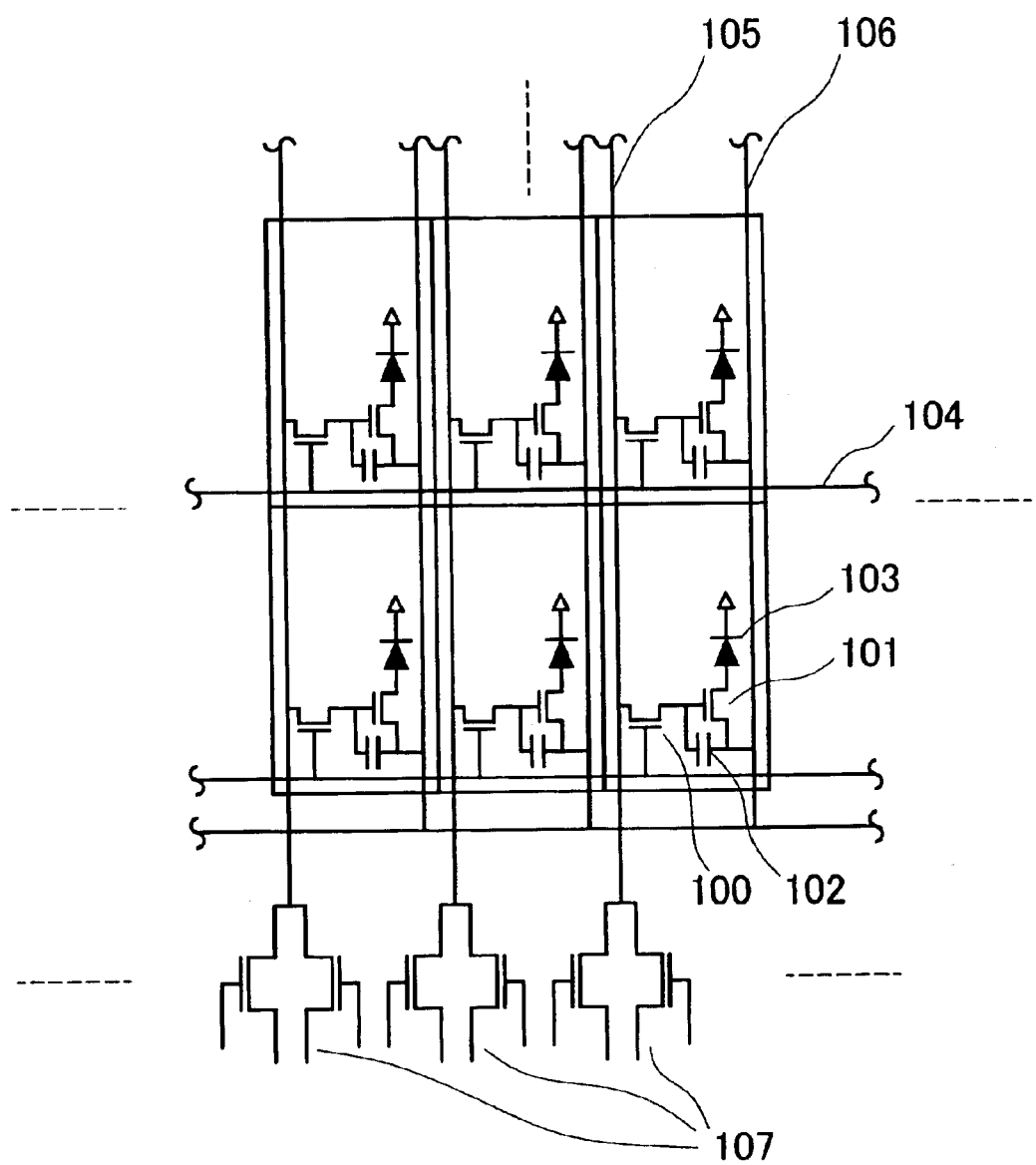
FIG. 9 is a circuit diagram of a schematic structure of a circuit built-in type TFT organic EL display device in accordance with the embodiment 2 of the present invention.

FIG. 9 shows two pixel parts and a part of a peripheral drive circuit in the region A in FIG. 1. Each pixel part has red, green and blue display pixels for color display. An N type channel pixel TFT 100 having a gate length of about 1 μm and a P type channel pixel TFT 101 for driving an organic light emitting diode 103 are provided to each pixel. Drain regions of each column of the N type channel pixel TFT's 100 are connected to an associated signal electrode line 105, and source regions of the N type channel pixel TFT's 100 are connected to associated gate electrodes of the P type channel pixel TFT's 101 and to associated threshold voltage correction capacitances 102. The gate electrodes of each row of N type channel pixel TFT's 100 are connected to an associated scan electrode line 104. Each P type channel pixel TFT's 101 is connected to an organic light emitting diode 103 to drive it. The sampling switch/buffer circuit block 2 for driving the signal electrode lines 105 is provided adjacent to the display pixel block 1, and circuits 107 each including P- and N type channel TFT's having a gate length of about 1 μm are connected to the associated signal electrode lines 105 respectively.

Each of the signal electrode lines 105 shown in FIG. 9 is connected to an analog signal input line via an associated sampling switch circuit. The sampling switch circuit, which inputs a shift pulse for video signal input from the shift register circuit block 3 via a buffer circuit, is scanned by the shift register circuit block 3.

Figure 10:
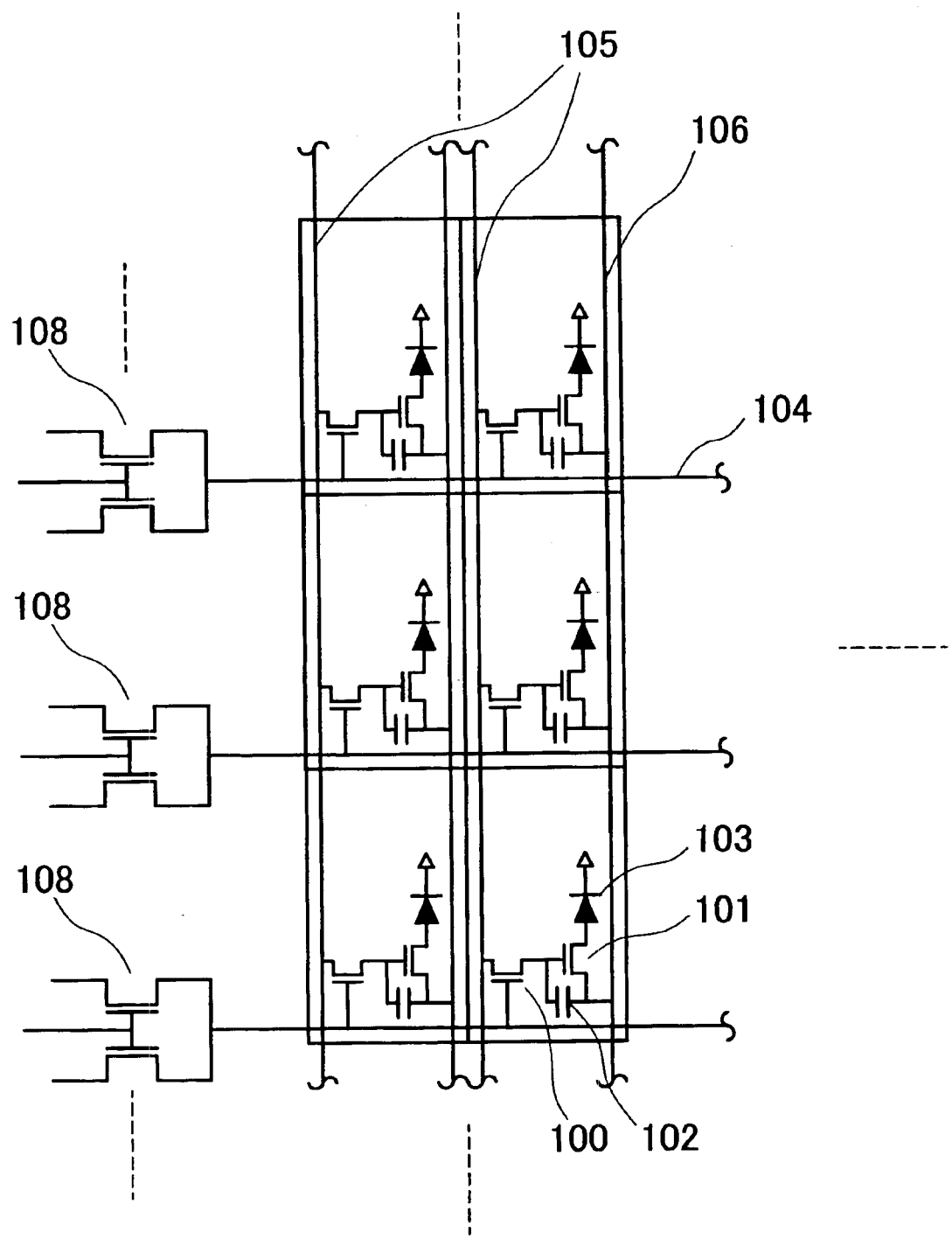
FIG. 10 is another circuit diagram of the schematic structure of the circuit built-in type TFT organic EL display device in accordance with the embodiment 2 of the present invention.

Shown in FIG. 10 are three pixel parts and a part of the peripheral drive circuit in the region B in FIG. 1. The structure of the pixel parts is substantially the same as that in FIG. 9. The buffer circuit block 5 for driving the scan electrode lines 104 is provided adjacent to the display pixel block 1, and each of circuits 108 having P- and N-type channel TFT's having a gate length of about 1 μm is connected to an associated scan electrode line 104.

The scan electrode lines 104 shown in FIG. 10 are connected to the shift register circuit block 6 via the buffer circuit block 5. The shift register circuit block 6 performs shifting operation and outputs a scanning shift pulse to scan the scan electrode lines 104.

TFT's forming these circuit blocks and display pixel block are formed by a manufacturing method similar to that of the embodiment 1. The TFT array and cross-sectional structure of the circuit blocks are also substantially the same as those in the embodiment 1. Accordingly the length of the crystal grain can be made larger than the gate length, and any of the horizontal and vertical direction TFT's can be increased in mobility to 500 cm$^2$/Vs or more. As in the embodiment 1, when horizontal and vertical direction TFT blocks are mixedly arranged when viewed from an identical straight line of the horizontal or vertical direction, efficient layout can be realized and the circuit occupation surface area can be reduced. Further, since the present invention is applied to the self light emitting type of organic EL display device in the embodiment 2, there can be realized a display device which is thin in size, light in weight, small in power consumption and suitable for moving image display.

Figure 11A:
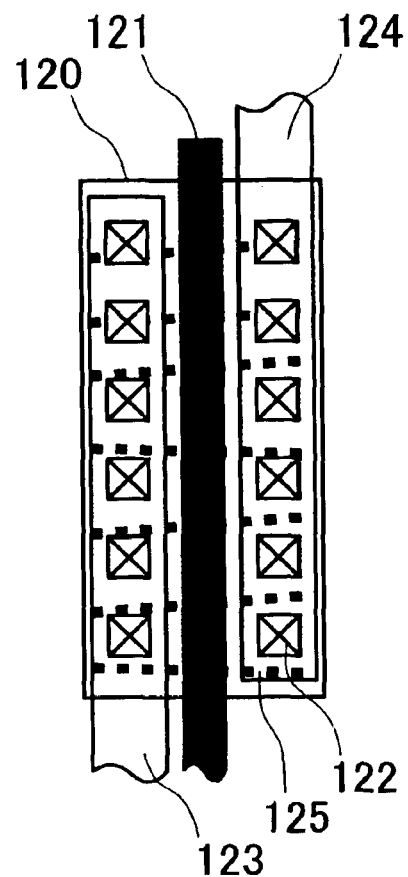
FIGS. 11A and 11B show, in model form, plan views of a schematic structure of a circuit built-in type TFT liquid-crystal display device in accordance with the embodiment 3 of the present invention.
Figure 11B:
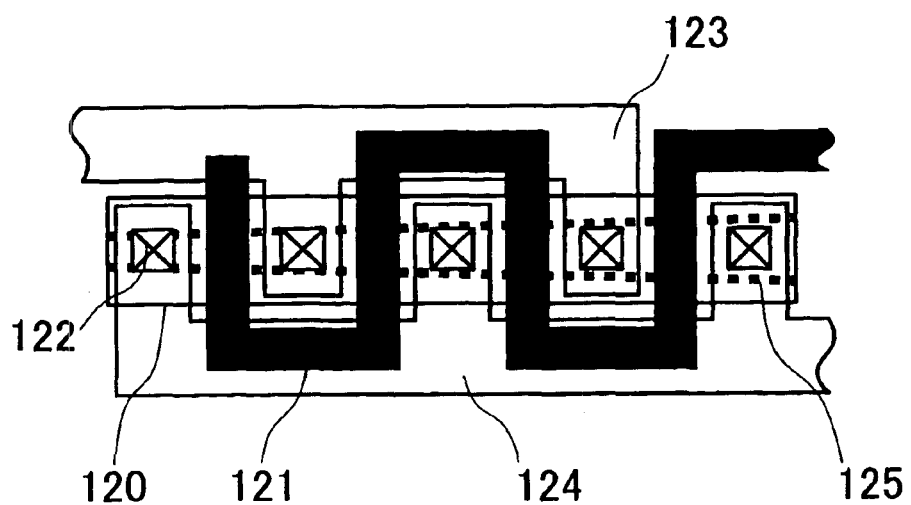
Figure 12A:
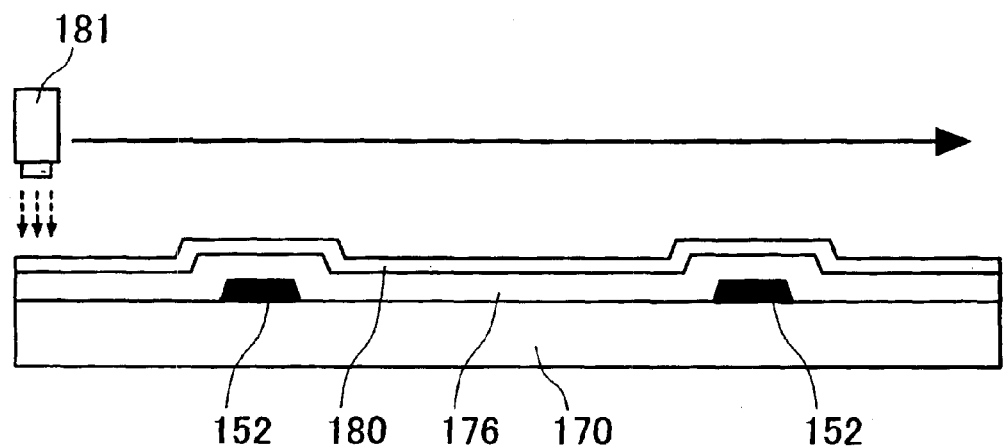
FIGS. 12A and 12B show, in model form, cross-sectional views of the circuit built-in type TFT liquid-crystal display device in accordance with the embodiment 3 of the present invention for explaining a TFT forming process.
Figure 12B:
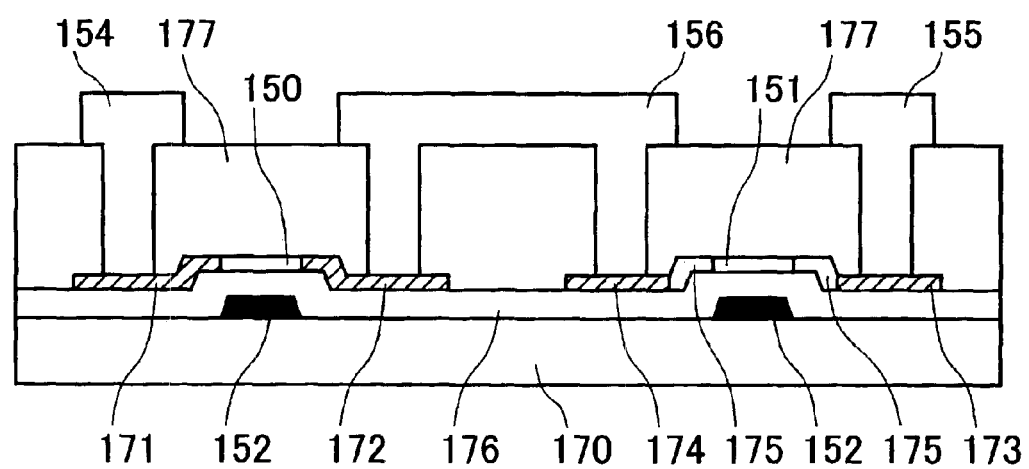

Embodiment 3:

FIGS. 11A and 11B show, in model form, plan views of a TFT in accordance with an embodiment 3 of the present invention, and FIGS. 12A and 12B show, in model form, cross-sectional views for explaining how to manufacture the TFT. The embodiment 3 will be explained by referring to FIGS. 1, 11 and 12.

The embodiment 3 is directed to a circuit built-in type TFT of transmissive liquid-crystal display device formed on a glass substrate when the present invention is applied to a full color monitor having a diagonal line length of about 40 cm. In the embodiment 3, the blocks 8, 9, 10, 11, 12 and 13 provided at four corners in FIG. 1 are made of high-mobility horizontal direction TFT's wherein the current direction is aligned with the longitudinal direction of the crystal grain in the horizontal direction.

Accordingly when the gate width of the circuit TFT's is wider in the vertical direction, TFT's are arranged as shown in FIG. 11A. And when the gate width cannot be made wider in the vertical direction due to a layout restriction, TFT's are arranged as shown in FIG. 11B. As a result, the circuit occupation surface area can be efficiently reduced. In this connection, it is not necessarily required that the blocks at the four corners of the display device be made of high-mobility TFT's. For example, even when only the gate array block 12 or only the data communication circuit block 13 is made of high-mobility TFT's, the effects of the present invention can be obtained. Further, the location of the blocks is not limited to the four corners of the display device. For example, only a part of the digital-analog converter circuit block 4 with a memory is made of high-mobility TFT's, the effects of the present invention can be obtained. The display device embodying the foregoing principles is not limited to the above specific embodiment but may be applied even to devices such as a liquid-crystal display device for a mobile personal computer or an organic EL display device.

As in the aforementioned embodiment 1, these TFT's are formed by the method using the solid-state laser, and a gate electrode 121 and contact via holes 122 are arranged so that the crystal grain surrounded by grain boundaries 125 is extended in the horizontal direction and aligned with the current direction from the drain to source. For this reason, even in any TFT array of FIGS. 11A and 11B, the mobility can be increased to 500 cm²/Vs or more. How to manufacture TFT's in the embodiment 3 is as follows. As shown in FIG. 12A, a first metal electrode made of, e.g., molybdenum as a base material is formed on a glass substrate 170 to have a film thickness of about 100 to about 200 nm, and then subjected to patterning operation to form a gate electrode 152. At this time, the processing gate length was set to be about 1 μm. The gate width was set to be about 1 to about 20 μm so as to obtain a necessary function according to circuit specifications.

Thereafter a gate oxide film 176 of silicon dioxide is deposited by the plasma CVD process to have a film thickness of about 50 to about 100 nm. Next a polycrystalline silicon film 180 is deposited, e.g., a catalytic CVD process at a low temperature of 500° C. or less to have a thickness of about 50 to about 100 nm.

Thereafter second higher harmonics having, e.g., a wavelength of 532 nm is irradiated from a solid-state laser 181 only on the block regions 8, 9, 10, 11, 12 and 13 at the four corners in FIG. 1 to recrystallize the polycrystalline silicon film. At this time, when the solid-state laser is scanned in the horizontal direction only in the surface of the display device while irradiating its laser beam, crystal grain can be promoted and crystal grains longer in the horizontal direction can be formed.

As shown in FIG. 12B, next, by lithography and silicon etching, islands 150 and 151 of polycrystalline silicon for formation of P- and N-type channel TFT's are patterned, impurity ions are selectively introduced into the polycrystalline silicon films 150 and 151, the films are subjected to annealing operation at a temperature of 500° C. or less to activate impurities, thus forming source and drain layers 171 and 172 of the P type channel TFT, source and drain layers 173 and 174 of the N type channel TFT, and an LDD layer 175 for reducing the electric field. In this connection, the LDD layer 175 and source/drain layers 171, 172, 173 and 174 can be formed by a method for performing selective ion implantation using a resist mask or by a method for selectively introducing impurity ions through a self alignment process. Further, it goes without saying that the processing gate length and gate width are not limited to the above values in the present embodiment but may be set at desired values so as to able to obtain a necessary function depending on circuit specifications.

Thereafter, an interlayer oxide film 177 of silicon dioxide is deposited by the plasma CVD process to have a thickness of about 500 nm, contact via holes are made therein, and then a second metal electrode of, e.g., aluminum as its main material, is used to provide a source electrode 154 of the P type channel TFT, a source electrode 155 of the P type channel TFT and a drain electrode 156, thus completing TFT's. Simultaneously, the first and second metal electrodes are used also as wirings for circuit formation. Thereafter an interlayer film, a transparent pixel electrode, etc. are provided to complete a TFT substrate. It goes without saying that the materials of the electrodes and insulating film used in the present manufacturing method are not limited to the above specific materials but other materials may be employed, providing substantially the same effects as the above. The circuit may be also formed, to include only one type of the N- and P-type channel TFT's.

By such a manufacturing method, the circuit blocks at the four corners of the display device are formed, e.g., by means of beam irradiation of the solid-state laser to include TFT's wherein crystal grains surrounded by grain boundaries 125 shown by dotted lines in FIGS. 11A and 11B are extended in the current direction from the drain to source by 10 μm or more. In this way, since the length of the crystal grain in the longitudinal direction can be made larger than the gate length and the crystal defect density in the current direction can be reduced, the TFT mobility can be increased to 500 cm²/Vs or more. Further, even in a block region not subjected to the beam irradiation of the solid-state laser, since a polycrystalline silicon film is deposited, there can be formed TFT's having a mobility of about 100 cm²/Vs.

In the embodiment 3, it is unnecessary to scan the solid-state laser in the horizontal and vertical directions twice while irradiating the laser beam and to irradiate the laser beam over the entire surface of the irradiation region as in the foregoing embodiment 1 or 2 of the present invention. As a result, the manufacturing time and the number of manufacturing steps can be reduced. Further, with respect to the block TFT array subjected to the laser beam irradiation of the solid-state laser, as shown in FIGS. 11A and 11B, TFT's long in the horizontal direction and TFT's long in the vertical direction can be mixedly provided while preventing deterioration of the TFT performance even through the one-time irradiation scanning of the solid-state laser. As a result, the circuit occupation surface area can be reduced.

Although the invention has been explained in detail in connection with the foregoing embodiments, it is not restricted to the aforementioned specific examples but may be modified in various ways without departing from its basic principles described herein.

In accordance with the embodiments of the present invention, high-performance TFT's having crystal grains aligned with the current direction can be formed in the entire display pixel region and in the entire circuit regions including the four corners of the display device in each block depending on the purpose of its active region, and thus there can be provided an image display device which has a high-performance integrated circuit It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A method for manufacturing an image display device driven by thin film transistors of a polycrystalline silicon film formed on a substrate, comprising:

a step of depositing an amorphous silicon film on said substrate;

a first laser irradiation step of scanning first laser beam irradiation relative to the substrate in a horizontal or vertical first scanning direction of a surface of the substrate, so as to irradiate a first region on the substrate without irradiating a second region thereon;

a second laser irradiation step of scanning second laser beam irradiation relative to the substrate in a second scanning direction perpendicular to said first scanning direction, so as to irradiate said second region without irradiating said first region; and a step of forming portions of the thin film transistors in said polycrystalline silicon film, wherein a portion of the amorphous silicon film in said first region is crystallized to form a portion of said polycrystalline silicon film in said first laser irradiation step, and a portion of the amphorus silicon film in said second region is crystallized to form another portion of said polycrystalline silicon film in said second laser irradiation step, and wherein of a plurality of blocks aligned in one of the horizontal and vertical directions, at least one block includes thin film transistors of which current flows substantially in said horizontal direction and at least one block includes thin film transistors of which current flows substantially in said vertical direction.

2. A method for manufacturing an image display device driven by thin film transistors of a polycrystalline silicon film formed on a substrate, comprising:

a step of depositing an amorphous silicon film on said substrate;

a scanning step of scanning a laser beam irradiation relative to the substrate in horizontal and vertical scanning directions of a surface of the substrate so as to crystallize the amorphous silicon film and to form the polycrystalline silicon film; and a step of forming portions of thin film transistors in the polycrystalline silicon film of a portion of pixel display area, wherein said portion of the pixel display area is irradiated only once in said scanning step.

3. The method for manufacturing an image display device as set forth in claim 1, wherein a plurality of lasers used in said first laser irradiation step are electrically controlled so as not to irradiate said second region during said first laser irradiation step, and a plurality of lasers used in said laser irradiation step are electrically controlled so as not to irradiate said first region during said second laser irradiation step.

4. The method for manufacturing an image display device as set forth in claim 1, wherein a portion of said first laser beam irradiation is selectively blocked so as to avoid irradiating said second region during said first laser irradiation step, and wherein a portion of said second laser beam irradiation is selectively blocked so as to avoid irradiation of said first region during said second laser irradiation step.

5. The method for manufacturing an image display device as set forth in claim 4, wherein the selective blocking of the first and second laser beam irradiation includes use of a shutter.

6. The method for manufacturing an image display device as set forth in claim 4, wherein the selective blocking of the first and second laser beam irradiation includes use of a shielding pattern.

* * * * *